(12) United States Patent
Wisdom

(10) Patent No.: US 10,056,732 B2
(45) Date of Patent: Aug. 21, 2018

(54) MECHANICALLY ISOLATED OPTICALLY PUMPED SEMICONDUCTOR LASER

(71) Applicant: Coherent, Inc., Santa Clara, CA (US)

(72) Inventor: Jeffrey Alan Wisdom, Brisbane, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 15/648,317

(22) Filed: Jul. 12, 2017

(65) Prior Publication Data

US 2018/0026423 A1 Jan. 25, 2018

Related U.S. Application Data

(60) Provisional application No. 62/364,516, filed on Jul. 20, 2016.

(51) Int. Cl.
| | |
|---|---|
| *H01S 5/00* | (2006.01) |
| *H01S 5/022* | (2006.01) |
| *H01S 5/024* | (2006.01) |
| *H01S 5/065* | (2006.01) |
| *H01S 5/04* | (2006.01) |
| *H01S 5/14* | (2006.01) |

(52) U.S. Cl.
CPC .......... *H01S 5/02248* (2013.01); *H01S 5/024* (2013.01); *H01S 5/02236* (2013.01); *H01S 5/02438* (2013.01); *H01S 5/02469* (2013.01); *H01S 5/02476* (2013.01); *H01S 5/041* (2013.01); *H01S 5/0654* (2013.01); *H01S 5/141* (2013.01); *H01S 2301/163* (2013.01)

(58) Field of Classification Search
CPC .. H01S 5/041; H01S 5/02236; H01S 5/02248; H01S 5/024; H01S 5/02469; H01S 5/141; H01S 5/02438; H01S 5/02476; H01S 5/0654; H01S 2301/163
See application file for complete search history.

(56) References Cited

U.S. PATENT DOCUMENTS 6,081,544 A * 6/2000 Zamel .................. H01S 3/025
372/103
6,097,742 A * 8/2000 Caprara ................ H01S 3/109
372/105
(Continued)

FOREIGN PATENT DOCUMENTS

EP 2044663 A1 4/2009

OTHER PUBLICATIONS

International Search Report and Written Opinion Received for PCT Application No. PCT/US2017/042014, dated Sep. 20, 2017, 12 pages.
(Continued)

*Primary Examiner* — Kinam Park
(74) *Attorney, Agent, or Firm* — Morrison & Foerster LLP

(57) ABSTRACT

A housing for an optically pumped semiconductor (OPS) laser resonator is terminated at one end thereof by an OPS-chip. The laser resonator is assembled on a platform with the OPS-chip at one end of the platform. The platform is fixedly attached to a baseplate at the OPS-chip end of the platform. The remainder of the platform extends over the baseplate with a gap between the platform and the baseplate. A pump-laser is mounted directly on the baseplate and delivers pump radiation to the OPS-chip.

7 Claims, 1 Drawing Sheet

(56) References Cited

U.S. PATENT DOCUMENTS

| | | | | |
|---|---|---|---|---|
| 6,693,941 B1* | 2/2004 | Okazaki | ............... | B82Y 20/00 |
| | | | | 372/70 |
| 8,891,580 B1* | 11/2014 | Anderson | ............... | H01S 3/086 |
| | | | | 372/107 |
| 9,031,114 B1* | 5/2015 | Von Elm | ............. | H01S 5/02252 |
| | | | | 372/93 |
| 2007/0116069 A1 | 5/2007 | Wang et al. | | |
| 2009/0252188 A1* | 10/2009 | Rossi | ................. | H01S 5/02415 |
| | | | | 372/34 |
| 2013/0243020 A1* | 9/2013 | Kim | ..................... | H01S 5/0224 |
| | | | | 372/36 |

OTHER PUBLICATIONS

Chen, et al., "Femtosecend High-Power Spontaneous Mode-Locked Operation in Vertical-External Cavity Surface-Emitting Laser With Gigahertz Oscillation", Optics Letters, vol. 36, No. 23, 2011, pp. 4581-4583.

\* cited by examiner

MECHANICALLY ISOLATED OPTICALLY PUMPED SEMICONDUCTOR LASER

PRIORITY CLAIM

This application claims priority of U.S. Provisional Application No. 62/364,516, filed Jul. 20, 2016, assigned to the assignee of the present invention, and the complete disclosure of which is hereby incorporated herein by reference.

TECHNICAL FIELD OF THE INVENTION

The present invention relates in general to optically pumped semiconductor (OPS) lasers. The invention relates in particular to packaging and housing of such lasers.

DISCUSSION OF BACKGROUND ART

OPS-lasers can provide several Watts (W) of continuous wave (CW) radiation output while oscillating in a single longitudinal mode. An OPS-laser typically includes a laser-resonator terminated at one end thereof by a mirror structure of an OPS-chip, and at an opposite end thereof by an output-coupling mirror. The mirror structure of the OPS-chip is surmounted by a periodic multilayer semiconductor gain-structure, which is energized by pump-radiation focused to a pump-spot on the gain-structure. Pump-radiation is typically supplied by a diode-laser package. Single-mode operation of the laser is favored by the location of the gain-structure at one end of the resonator and by the periodic nature of the gain-structure. A detailed description of optical aspects of OPS lasers is presented in U.S. Pat. No. 6,097,742, the complete disclosure of which is hereby incorporated by reference. This patent describes, in detail, straight and folded resonators with fundamental and frequency doubled output.

OPS-lasers are typically packaged, self-contained, with the OPS laser resonator and the pump-radiation source in a single housing. A problem with this packaging is that factors such as thermally generated stress or mechanical stress may, at least temporarily, distort the housing. This distortion can lead to misalignment of the pump-radiation spot and the oscillating mode of the laser-resonator. This misalignment can lead to problems such as mode-hopping (from one possible single oscillating mode to another), and output noise. There is a need for an OPS-laser packaging arrangement in which misalignment of the pump-radiation spot and the oscillating mode under thermal or mechanical stress can be reduced if not altogether eliminated.

SUMMARY OF THE INVENTION

In one aspect, laser apparatus in accordance with the present invention comprises a cantilever platform having first and second opposite ends and a baseplate having first and second opposite surfaces. An optically pumped semiconductor (OPS) laser-resonator terminated is terminated at one end thereof by an OPS-chip. The OPS laser-resonator is assembled on the cantilever platform with the OPS-chip bonded to a heat-sink attached to the first end of the cantilever platform. The first end of the cantilever platform is supported on the baseplate, and a remaining portion of cantilever platform including the second end thereof extends over the baseplate with a gap between the remaining portion of the cantilever platform and the baseplate. A pump-radiation supply is mounted on the first surface of the baseplate and arranged to deliver optical pump radiation to the OPS-chip for energizing the OPS laser-resonator.

DETAILED DESCRIPTION OF THE INVENTION

Figure 1A:
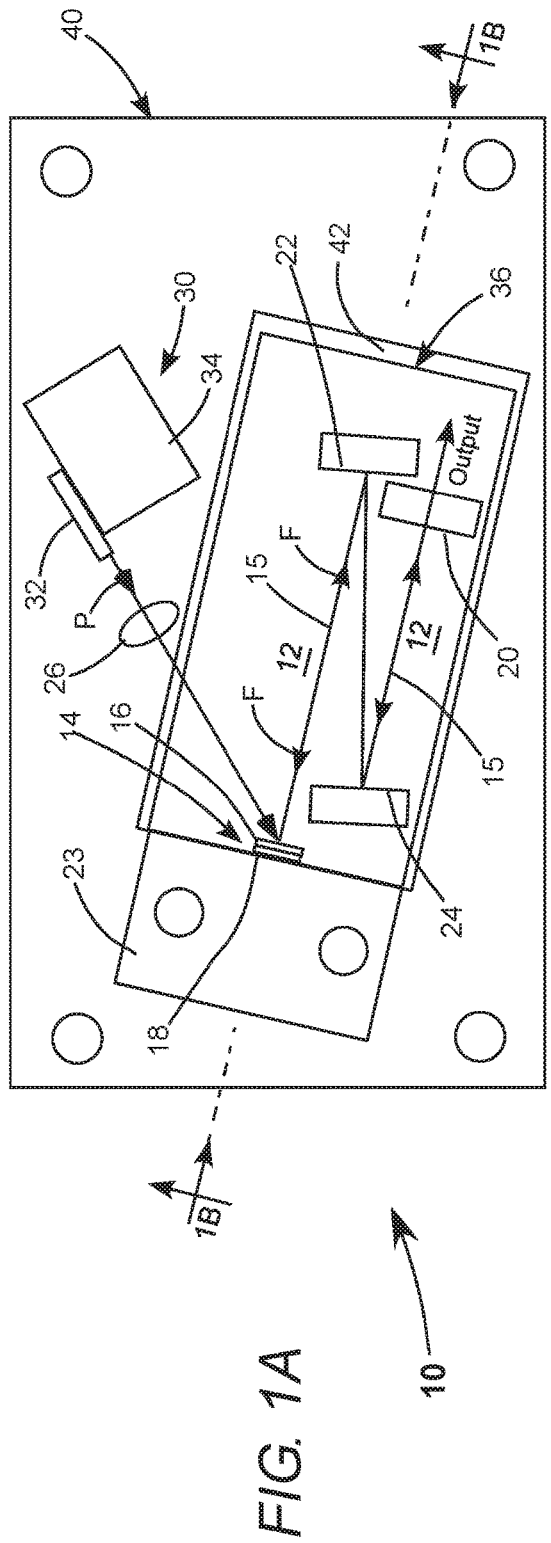
FIG. 1A is a plan view from above schematically illustrating a preferred embodiment of a mechanically isolated OPS-laser resonator in accordance with the present invention including an OPS laser resonator held on a cantilever plate, with the cantilever plate attached at one end thereof to a baseplate, and with the remaining portion of the cantilever plate suspended over a cut-out portion of the baseplate and with an optical pump laser mounted directly on the baseplate.
Figure 1B:
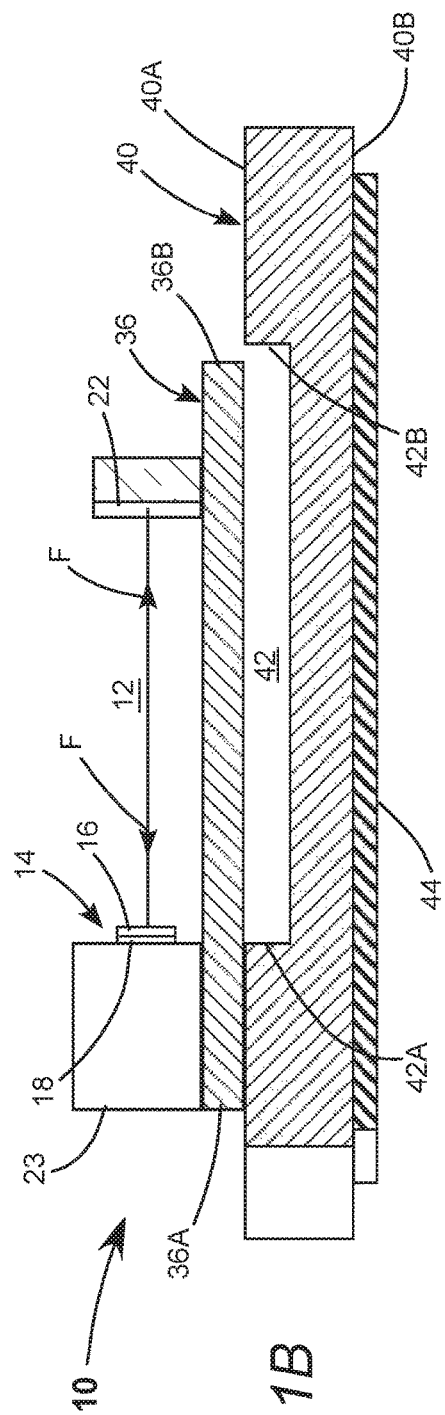
FIG. 1B is a cross-section view, seen in the direction 1B-1B of FIG. 1A, schematically illustrating further details of the cantilever plate and baseplate.

Turning now to the drawings, FIG. 1A and FIG. 1B schematically illustrate a preferred embodiment 10 of a mechanically isolated OPS-laser in accordance with the present invention. Laser 10 includes a laser resonator 12 terminated by a mirror structure 14, an OPS-chip 18 and an output-coupling (partially transmissive) end-mirror 20. Resonator 12, here, is twice-folded by mirrors 22 and 24. A semiconductor gain-structure 16 surmounts mirror-structure 14 in OPS-chip 18. The OPS-chip is mounted on a thermally conductive base (heat-sink) 23.

Pump-radiation P is supplied by a pump radiation source 30 including a diode-laser 32 bonded to a thermally conductive base 34. Pump-radiation P is focused by a lens 26 onto gain-structure 16 of OPS-chip 14. Focusing the pump-radiation onto gain structure 14 causes fundamental-wavelength laser-radiation to circulate in laser-resonator 12 as indicated by arrows F along an oscillating mode 15 of the resonator.

The fundamental wavelength is characteristic of the composition of gain-structure 16. Typically an OPS-laser resonator includes a birefringent filter (BRF) for selecting the fundamental wavelength from a gain-bandwidth of the gain-structure. This is not shown in the drawings for simplicity of illustration.

It should be noted here that only sufficient details of resonator 12 and optical pumping arrangements for gain-structure 14 are provided for understanding principles of the present invention. Detailed descriptions of several OPS-laser resonators, fundamental and frequency-converted, are provided in above-referenced U.S. Pat. No. 6,097,742. The invention is applicable to any OPS laser-resonator, including intra-cavity frequency-converted resonators.

Turning now to thermal and mechanical aspects of the inventive OPS-laser, all components of laser-resonator 12, including OPS-chip 14 mounted on base 23 are mounted on an elongated cantilever platform 36. Base 36 is mounted on end 36A of platform 36.

Cantilever platform 36, with laser-resonator 12 thereon, is mounted on a baseplate 40 having an elongated rectangular trough 42 machined into upper surface 44A thereof. The cantilever platform is mounted with end 36A thereof attached to upper surface 40A baseplate 40 such that base 23 supporting OPS-chip 14 is about flush with end 42A of trough 42 in baseplate 40. End 36B of the cantilever platform is suspended over trough 42, close to, but not overlapping, end 42B of trough 40.

Pump-radiation source 30 and lens 26 are mounted to upper surface 40A of baseplate 40. Base 23 with OPS-chip 14 thereon is effectively (indirectly) fixedly mounted on baseplate 40 as a result of being mounted on a portion of cantilever plate 36 that is not suspended over trough 42. With laser-resonator 12 being effectively mechanically isolated from baseplate 40, oscillating mode 15 of the resonator will remain at about the same spot on gain-structure 14 for any anticipated flexure.

Those skilled in the mechanical art will recognize that, in general, dimensions of trough 42 are preferably just sufficiently greater than corresponding dimensions of cantilever plate 36 to allow the cantilever plate to flex into the trough if necessary. The depth of the trough is preferably just sufficient to accommodate the maximum anticipated flex of the cantilever plate. This provides that any adverse effect of trough 42 on stiffness of baseplate. 40 is minimized. Those skilled in the mechanical art will recognize that while cantilever platform 36 is described above as having a rectangular shape, the platform, and corresponding trough, may have any other shape, regular, or irregular, without departing from the spirit and scope of the present invention.

Suitable dimensions will depend on materials selected for baseplate 40 and cantilever platform 36. From the description of the present invention presented above, those skilled in the art determine suitable dimensions using commercially available mechanical design software such as SOLIDWORKS, available from Dassault Systèmes SolidWorks Corporation of Waltham, Mass.

A primary function of baseplate 40 is providing mechanical support for resonator 12 on cantilever platform 36 while allowing mechanical isolation of the laser resonator from the baseplate. A preferred material for the baseplate, and platform 36, is aluminum (Al). While this will provide for conduction of heat away from OPS-chip 14 during operation, it will not provide for rapid dissipation of that heat. Laser 10, includes a separate heat-sink 44 on lower surface 40B of the baseplate for assisting heat-dissipation. Heat sink 44 may be a simple plate of a highly conductive material such as copper (Cu) or may be a more complicated structure including arrangements for water cooling or air cooling.

In summary, the present invention is described above with reference to a preferred embodiment. The invention is not limited, however, to the embodiment described and depicted herein. Rather the invention is limited only by the claims appended hereto.

What is claimed is:

1. Laser apparatus, comprising:
   a cantilever platform having first and second opposite ends;
   a baseplate having first and second opposite surfaces;
   an optically pumped semiconductor (OPS) laser-resonator including an OPS-chip, the OPS laser-resonator assembled on the cantilever platform with the OPS-chip bonded to a heat-sink attached to the first end of the cantilever platform;
   wherein the first end of the cantilever platform is supported on the baseplate, and a remaining portion of cantilever platform including the second end thereof extends over the baseplate with a gap between the remaining portion of the cantilever platform and the baseplate; and
   wherein a pump-radiation source is mounted on the first surface of the baseplate and arranged to deliver optical pump radiation to the OPS-chip for energizing the OPS laser-resonator.

2. The apparatus of claim 1, wherein the gap between the remaining portion of the cantilever platform and the baseplate is provided by a trough formed in the first surface of the baseplate.

3. The apparatus of claim 2, wherein the cantilever platform is rectangular and the trough is rectangular.

4. The apparatus of claim 1, wherein the pump radiation source includes a diode-laser.

5. The apparatus of claim 1, wherein the laser resonator is a folded laser resonator.

6. The apparatus of claim 1, further including a heat-sink attached to the second surface of the baseplate.

7. The apparatus of claim 1 wherein one end of the laser-resonator terminates in the OPS-chip.

* * * * *